United States Patent [19]

Levy

[11] Patent Number: 4,717,834
[45] Date of Patent: Jan. 5, 1988

[54] STRIPLINE TRANSFORMER ADAPTED FOR INEXPENSIVE CONSTRUCTION

[75] Inventor: Stephen Levy, Ocean, N.J.

[73] Assignee: The United States of America as represented by the Secretary of the Army, Washington, D.C.

[21] Appl. No.: 517,607

[22] Filed: Jul. 27, 1983

[51] Int. Cl.$^4$ ............................................. H03K 3/00
[52] U.S. Cl. ..................................... 307/106; 336/230
[58] Field of Search ................. 307/106; 328/59, 65; 336/230

[56] References Cited

U.S. PATENT DOCUMENTS

| | | | |
|---|---|---|---|
| 3,289,015 | 11/1966 | Fitch et al. | 307/110 |
| 3,366,799 | 1/1968 | Fitch | 307/110 |
| 4,028,559 | 6/1977 | Larner | 328/65 X |
| 4,140,917 | 2/1979 | Weiner | 307/106 |
| 4,176,285 | 11/1979 | Norris | 307/106 |
| 4,404,476 | 9/1983 | Lezan | 328/65 X |

OTHER PUBLICATIONS

"Novel Principle of Transient High-Voltage Generation", by Fitch et al., IEE, vol. III, No. 4, Apr. 1964.
"A Helical Pulse-Voltage Generator", by Gerasimou et al., Sci. Research Institute of Electrophysical Equipment, No. #3, pp. 163-165, May-Jun. 1970.
"Focus on Wire & Cable:Start with Insulation and Conductivity-But Be Ready for Much More", Electronic Design #10, May 10, 1979.

Primary Examiner—A. D. Pellinen
Assistant Examiner—Derek S. Jennings
Attorney, Agent, or Firm—Sheldon Kanars; Jeremiah G. Murray; Edward Goldberg

[57] ABSTRACT

A stripline transformer pulse generator includes a flat ribbon multiple conductor cable and a ground plane of electrically conductive material placed side-by-side and wound together in a coil to form a transformer. The extremities of at least some of the conductors are joined in parallel and connected to a load. A voltage supply and switch connected between the ground plane and one end of the cable brings about charging and discharging of the device.

7 Claims, 3 Drawing Figures

STRIPLINE TRANSFORMER ADAPTED FOR INEXPENSIVE CONSTRUCTION

STATEMENT OF GOVERNMENT INTEREST

The invention described herein may be manufactured, used and licensed by or for the Government for Governmental purposes without the payment to me of any royalties thereon or therefor.

BACKGROUND OF THE INVENTION

This invention relates generally to pulse generation and, more particularly, to an apparatus and method for generating pulse waveforms utilizing inexpensive, lightweight and expendable devices.

Inexpensive pulser transformers are required in a variety of applications, some of which are used by the military. Such military applications include remotely piloted vehicle and laser target designations which require a short-term, high energy pulse which is reproducible at a relatively high repetition rate.

Most of the existing devices of this type have operated on the principle of vector inversion such as that described in an article entitled "Novel Principle of Transient High Voltage Generation", by R. A. Fitch et al. (Proceedings of the Institution of Electrical Engineers; Volume III, No. 4; April, 1964; pp. 849–855) and U.S. Pat. No. 3,289,015, entitled "Pulse Generator", issued to R. A. Fitch et al. on Nov. 29, 1966.

The prevailing designs for such devices have used either the pulse stacked stripline transformer or transformers having lumped inductors magnetically coupled on a core. In either case, a highly specialized construction is required which both reduces flexibility and increases manufacturing costs.

With applications for such transformers becoming more numerous, the primary concerns regarding these devices involve portability, low cost and design flexibility. The expense factor is of particular importance in military uses since a large number of applications are self-destructing with the first use. Other concerns are small overall physical size, low weight, ruggedness and electrical adaptability for high voltage multiplication for various loading impedances.

SUMMARY OF THE INVENTION

The present invention comprises an energy storage device or voltage transformation device of novel construction wherein the primary element of the device is readily and commercially available. Such an approach reduces costs and simplifies construction while providing a device of compact size and low weight.

The device includes a flat ribbon multiple conductor cable and a ground plane of electrically conductive material placed side-by-side and wound together in a coil to form a transformer. The extremities of a least some of the conductors at one end of the ribbon cable are electrically connected together to form the first of two output terminals. The ends of the same conductors at the other end of the ribbon cable are connected together to form the second output terminal. Two input terminals include one of the output terminals and the ground plane. A switch is connected across the input terminals to short out the input to the transformer and the low-voltage input source. By vector inversion, a high-energy output pulse is produced across the pair of output terminals. The method of shaping the output pulse characteristics is described in terms of the geometry and design specifications of the transformer element.

In some of the additional aspects of the invention, the multiple conductor ribbon cable includes a plurality of conductors, all being connected together at each end of the ribbon cable to form the pair of output terminals. In another embodiment, the ground plane is a fully integrated part of the ribbon cable. The low-voltage source includes a battery resistively coupled to the input terminals and across a switch. The switch may include wetted mercury contacts in order to provide rapid closure and a low shorting impedance.

These and other objects and advantages of the invention will become apparent from the following detailed description and drawings.

DETAILED DESCRIPTION OF A PREFERRED EMBODIMENT

Figure 1:
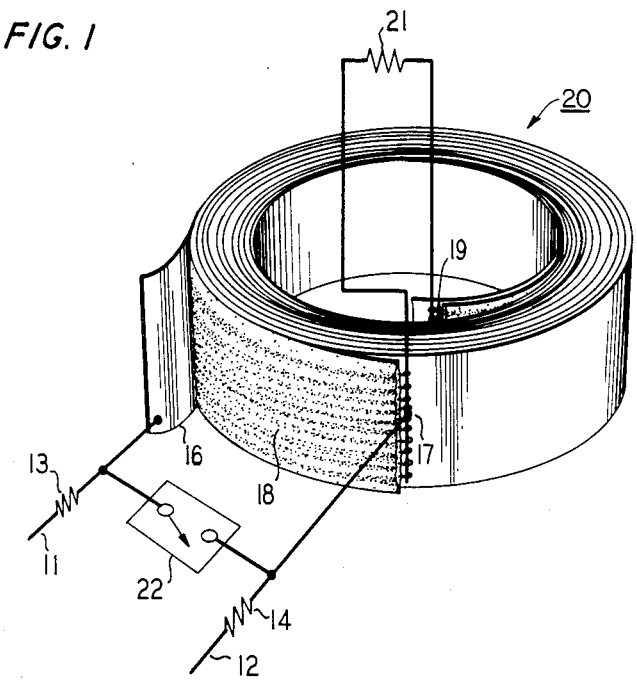
FIG. 1 is a pictorial representation of an embodiment of the invention.

Referring to FIG. 1, there is shown a pulse transformer device constructed in accordance with the invention. Transformer 20 includes alternate layers of a metallic foil ground plane 16 and a ribbon cable 18 wound in a spiral or cylindrical fashion. Junctions 17 and 19, at opposite ends of ribbon cable 18, serve as the output terminals for delivering a high voltage, short duration pulse to load resistor 21. Input terminals 11 and 12, connected to a suitable power source such as a battery, apply a low voltage to the input portion of transformer 20 by way of resistors 13 and 14, respectively. More specifically, resistor 13 is connected to the metallic foil ground plane 16, while resistor 14 is connected to junction 17 which electrically couples a number of conductive wires contained within ribbon cable 18. The remaining portion of the input circuit of the device of FIG. 1 is switch 22, preferably a mercury wetted reed relay which provides high speed and low impedance. When switch 22 is open, the conductive wires of cable 18 are charged such that the voltage vectors of the wires are arranged in series opposition with a resulting net voltage of zero. When switch 22 is closed, vector inversion causes alternate vectors to be inverted to thereby produce a stepped up voltage pulse to be applied to load resistor 21.

In most applications, it is desirable to have a specific characteristic output impedance for matching the value of the load impedance. In accordance with the references previously cited herein, the appropriate formula for the impedance characteristic, $Z_{ch}$, is:

$$Z_{ch} = \frac{120\pi b}{\epsilon_r^{\frac{1}{2}} \Sigma w}$$

where:
  $b$ = dielectric thickness between ground planes,
  $\Sigma w$ = conductor width, and
  $\epsilon_r$ = dielectric constant for the insulator.

For a typical flat ribbon cable of eight conductors having a dielectric thickness of $b = 0.03175$ cm. and a conductor width $w = 0.508$ cm., the characteristic impedance is shown to be $Z_{ch}=1.51$ ohms. One such device was tested using a twelve-foot long section of ribbon cable wrapped into a cylinder having twenty turns. For such a case, the typical output impedance, $Z_o$, is given by:

$Z_o = n^2 Z_{ch}$ where n=no. of turns
$Z_o = (20)^2 (1.51$ ohms)
$Z_o = 604$ ohms Since a device such as the transformer 20 of FIG. 1 is often used in short-life applications, low cost is a major concern. A paramount feature of the invention is that component 18 of FIG. 1 is commercially available in the form of ribbon cable. Typically, ribbon cable utilizes a plurality of conductors individually insulated from one another and embedded in a common sheet of insulating material. Commonly used insulation materials are polyvinyl chloride (PVC), polypropylene or polycarbonate. One factor to be considered in choosing the appropriate insulator is that the material selected should have a sufficiently high voltage breakdown to withstand the characteristic operating voltages of the transformer. Another consideration is the fact that the winding capacitance and lumped inductance exhibited by the ribbon cable play an important role in the high frequency operation of the device. Another option available in some commercially available ribbon cable provides a built-in ground plane in the form of a metallic foil affixed to one side of the cable making it ideal for some applications.

Figure 2:
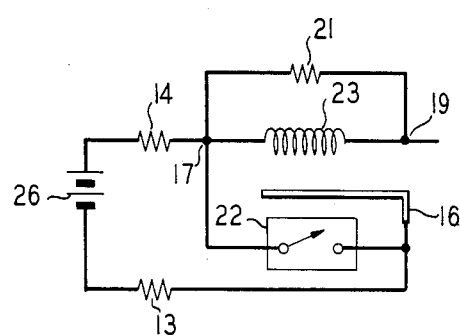
FIG. 2 is a electrical circuit diagram of the device of FIG. 1.

Referring now to FIG. 2, there is shown a circuit diagram for the transformer of FIG. 1. Battery 26 is a low voltage source which is connected via resistors 13 and 14 to metallic foil ground plane 16 and junction 17, respectively. Between junctions 17 and 19 at the ends of coil 23 is connected load resistor 21. When switch 22 is in the open position, coil 23 is in a charging state and, when the switch is closed, an output voltage pulse is applied to load resistor 21 from the energy stored in the transformer by the cooperation of ground plane 16 and coil 23. Coil 23 represents the electrical equivalent of the plurality of wires present in ribbon cable 18 such that the individual conductors are electrically connected together at one end of ribbon cable 18 at junction 17 and at the other end at junction 19. Junctions 17 and 19 are in the form of soldered strips spanning the width of ribbon cable 18.

Figure 3:
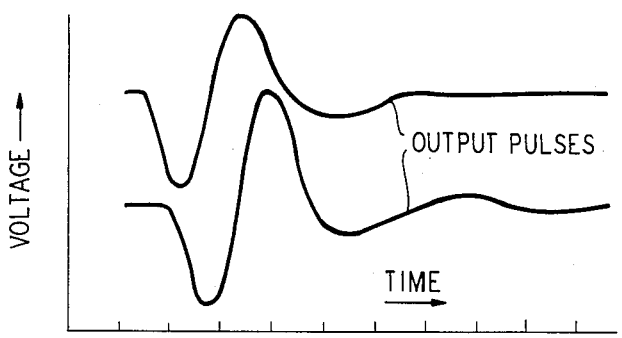
FIG. 3 is a graphical illustration of typical pulse output waveforms provided by the device of FIG. 1.

FIG. 3 depicts typical output pulse waveforms obtained from a pulse transformer constructed in accordance with the invention. Using commercially available flat ribbon cable of twelve feet in length and having eight conductors, a twenty-turn cylinder was constructed having an inside diameter of 1.9 inches and an outer diameter of 2.5 inches. All eight copper conductors were shorted at both ends as in FIG. 1 and a fifty ohm load resistor was disposed between the output terminals. The ratio of calculated optimum load (755 ohms) to actual load for this case is about fifteen-to-one. This is the effective gain (open circuit voltage gain) of the pulse transformer.

The waveforms of FIG. 3 represent the output of the transformer described previously. Each increment along the horizontal axis represents an interval of time corresponding to 20 nanoseconds. As shown, each pulse has an approximate rise time of 20 nanoseconds, a fall time of 20 nanoseconds and a relatively flat-topped or intermediate portion of approximately 20 nanoseconds. The open circuit voltage peak in the output first pulse (negative going) is about fifteen times the voltage of the low voltage source. For the second output pulse (positive going), the peak voltage is 2500 volts. Under open circuit conditions, the first peak of the output pulse was fifteen times the power supply voltage and the peak-to-peak voltage swing was four thousand volts. The two output waveforms shown in the graph demonstrate the reproducible fidelity provided by a transformer constructed in the manner specified.

While the general purpose of this device is to generate a high voltage spike, or pulse, from a low voltage power source, several other advantages are found in this commercially available ribbon cable which, in addition to particular design. One such advantage lies in the use of the construction convenience and low cost, offers flexibility in terms of manufacturing alternatives and electrical options. For example, by combining a number of strips in a ribbon, the impedance of the pulse line may be altered thereby changing the shape of the waveform. By mechanically linking several strips of varying lengths in the ribbon, custom waveforms may be generated. In this case, each of the cables may be wound together with one ground foil or with separate ground foils.

Further the gain, pulse width and impedance may be controlled by varying the cable geometry and the geometry of the wound spiral. For example, where a large peak-to-peak voltage swing is desirable, a tightly bound spiral would be used. This configuration could have application in electro-optic switches or in the pulse operation of laser diodes. Further, by differentiating the output, one may obtain a fast-rising, narrow pulse. Alternatively, a spiral having a relatively larger diameter will result in greater pulse fidelity at higher impedances. Still another modification would have only selected conductors of the ribbon cable connected together in parallel. This would also provide a different output impedance characteristic and waveform.

It should be understood, of course, that the foregoing relates only to a preferred embodiment of the invention and that numerous modifications or alterations may be made therein without departing from the spirit and scope of the invention as set forth in the appended claims.

What is claimed is:

1. A stripeline transformer pulse generator comprising a coil for storing energy, said coil including a flat ribbon cable having a plurality of parallel spaced conductors extending the length of said cable and a flat longitudinal strip of dielectric material enclosing said conductors, said conductors being individually surrounded and separated from each other by said dielectric material, at least two of said conductors being connected together in parallel at the respective opposite ends to form first and second junctions providing a pair of output terminals;

a flat ground plane longitudinal strip of electrically conductive material positioned along one flat side of said dielectric strip and substantially equal in width and length to said ribbon cable, said ribbon cable with said enclosed conductors and said ground plane being wound together to form a spiral having a plurality of turns such that said ribbon cable and said ground plane form alternating layers of said spiral, one end of said ground plane and said first juction providing a pair of input terminals;

load means connected between said first and second junctions;

a source of low potential connected between said one end of said ground plane and said first junction input terminals for charging said coil; and switching means connected across said input terminals for shorting out said source and discharging said coil to supply a high potential short duration output pulse to said load means.

2. The device of claim 1 wherein said input means includes a pair of input resistors respectively connected to opposite terminals of said source and in series with said input terminals.

3. The device of claim 1 wherein all of said conductors of said ribbon cable are connected together in parallel at said respective ends.

4. The device of claim 1 wherein said ground plane is an integral component of said ribbon cable.

5. The device of claim 1 wherein said switching means includes a low impedance mercury-wetted reed relay.

6. The device of claim 1 wherein the number of turns, n, of said coil is determined by the relationship $n = (Z_o/Z_{ch})^{\frac{1}{2}}$, where $Z_o$ is the desired output impedance of said device and $Z_{ch}$ is the characteristic impedance of said ribbon cable.

7. The device of claim 3 wherein said conductors of said coil have potential vectors, said conductors being charged by said potential source such that said potential vectors of alternate turns along said coil are in series opposition when said switching means is open and alternate vectors are inverted when said switching means is closed to short out said input terminals and produce a stepped up high potential output pulse.

* * * * *